United States Patent [19]

Leehan

[11] 3,832,574

[45] Aug. 27, 1974

[54] FAST INSULATED GATE FIELD EFFECT TRANSISTOR CIRCUIT USING MULTIPLE THRESHOLD TECHNOLOGY

[75] Inventor: Gerald W. Leehan, Centreville, Va.

[73] Assignee: International Business Machines Corporation, Armonk, N.Y.

[22] Filed: Dec. 29, 1972

[21] Appl. No.: 319,255

[52] U.S. Cl. ................. 307/205, 307/215, 307/279, 307/304, 357/41

[51] Int. Cl... H03k 19/08, H03k 19/34, H011 19/00

[58] Field of Search........ 307/205, 221 C, 251, 279, 307/304, 214, 215; 317/235 B, 235 G

[56] References Cited

UNITED STATES PATENTS

| | | | |
|---|---|---|---|
| 3,135,926 | 6/1964 | Bockemuehl | 307/251 |
| 3,475,621 | 10/1969 | Weinberger | 307/215 |
| 3,502,950 | 3/1970 | Nigh | 317/235 B |
| 3,539,839 | 11/1970 | Igarashi | 307/303 |
| 3,654,623 | 4/1972 | Campbell | 307/279 |
| 3,700,981 | 10/1972 | Masuhara | 307/205 |
| 3,702,943 | 11/1972 | Heuner | 307/251 |

OTHER PUBLICATIONS

Axelrod "Speed-up Circuit For NOR Circuits . . ." pp. 168–169, IBM Technical Disclosure Bull., Vol. 7, No. 2, July 1964.

Baitinger "Field-Effect Transistor Decoder" IBM Technical Dis. Bull., Vol. 15, No. 1, June 1972, pp. 234–235.

*Primary Examiner*—Rudolph V. Rolinec

*Assistant Examiner*—L. N. Anagnos

*Attorney, Agent, or Firm*—Sughrue, Rothwell, Mion, Zinn & Macpeak

[57] ABSTRACT

An integrated logic circuit using FETs having different threshold characteristics to assure that the FETs having the lower threshold voltage turn ON before those having a high threshold voltage when their gates are connected to a common node. Thus it is possible to use a low threshold FET diode as a series element in the discharge path between the logic output node of a conventional NOR circuit and its load. This diode isolates the conventional NOR from the interconnection capacitance, thus eliminating the effect of the interconnection capacitance on rising transitions at the logic output node. Furthermore, since low threshold devices can exist within the same circuit as the necessarily high threshold input FETs, two lower threshold FETs can be connected in series such that the input capacitance of a succeeding stage can be charged to a logic 1 voltage that is less than the power supply voltage by the gate to source voltage of the two lower threshold FETs. This logic 1 voltage is higher since the threshold of these two devices is lower than would be possible in single threshold technology. Also, the second of the two lower threshold FETs can serve as a charging means for the input capacitance of the succeeding stage while maintaining the isolation between that capacitance and the output of the conventional NOR circuit. Thus, multiple threshold technology can be used to reduce the effect of the interconnection capacitance of succeeding logic stages, while increasing the logic level.

12 Claims, 2 Drawing Figures

PATENTED AUG 27 1974

3,832,574

FAST INSULATED GATE FIELD EFFECT TRANSISTOR CIRCUIT USING MULTIPLE THRESHOLD TECHNOLOGY

BACKGROUND OF THE INVENTION

1. Field of the Invention

This invention relates to integrated logic circuits and more particularly to integrated logic circuits comprising insulated gate field effect transistors (FET) wherein FETs on the same chip have different threshold characteristics.

2. Description of the Prior Art

In the prior art, when a single logic stage is used to drive a plurality of succeeding logic stages in an integrated logic circuit, the rise time of the output of the single logic stage is dependent upon the fan out and loading of succeeding stages. This is due to the loading effect that the interconnection capacitance, which includes the interelectrode capacitance of the input FETs of the succeeding logic stages and the capacitance of the metallization interconnecting the stages, has on the FET whose charging rate controls rise time.

In prior art NOR circuits, for example, the charging and discharging means of the interconnection capacitance are connected to a common logic output node. Thus the logic output node is loaded by the interconnection capacitance and thereby transition times at the node are affected by the interconnection capacitance.

Also in the prior art, the broad concept of designing a chip with FETs having different threshold characteristics is known as evidenced by U.S. Pat. No. 3,502,950, although the application of this concept to particular circuits is not disclosed. Additionally, the broad concept of using different size gates on a single chip is old in the art as evidenced by U.S. Pat. No. 3,539,839. However, in this patent, the different gates are used to vary the channel conductance rather than to control the threshold voltage of the FET.

SUMMARY OF THE INVENTION

It is the primary object of this invention to provide an integrated logic circuit in which the transition times of the output voltage of a driving stage is independent of the fan out and loading on the output.

It is another object of this invention to provide an integrated logic circuit which includes a plurality of FETs on a single chip wherein the FETs have different threshold voltages of predetermined values.

This invention is directed to an integrated logic circuit which includes a plurality of FETs on a single chip. One of the FETs has a first threshold voltage and another of the FETs has a different threshold voltage wherein one of the threshold voltages is greater than the other. The circuit is designed with the gates of two FETs having different threshold voltages coupled to the same node, which is the logic output node, such that the FET with the lower threshold voltage always turns ON prior to the FET with the higher threshold voltage. The integrated circuit is arranged such that the FET having the higher threshold voltage is the input FET to the succeeding logic stage while the FET having the lower threshold voltage provides a discharge path for the charge stored on the interconnection capacitance which includes the input capacitance of the succeeding logic stage and the capacitance of the metallization of the interconnection between the logic circuit and the succeeding logic stages. The FET having the lower threshold is connected between the logic output node of a prior art circuit and the logic output node of the circuit of this invention and thus isolates the two nodes. Therefore transition times on the logic output node of prior art circuits are made faster since it is not affected by the interconnection capacitance. The logic output node of the prior art circuit is, however, still used in the circuit of this invention to control the transitions and thus transitions are controlled as in the prior art but not affected by the interconnection capacitance as in the prior art.

To turn ON the succeeding logic stage, the interconnection capacitance is charged to a voltage equal to the power supply voltage less the sum of the gate-to-source voltages of two other FETs. If the threshold voltage which is the gate-to-source voltage is reduced for one or two other FETs, then the voltage to which the interconnection capacitance is charged is increased, thus increasing the voltage representing logic 1 at the input of the succeeding stage.

A circuit designed in this manner is a high performance circuit in which the transition times of the output are relatively insensitive to the output loading.

Furthermore, the circuit is arranged such that the large conductance in the discharge path is only in the circuit during discharge and therefore, the quiescent power dissipation occurs only in FETs having low conductance.

DESCRIPTION OF THE PREFERRED EMBODIMENT

Figure 1:
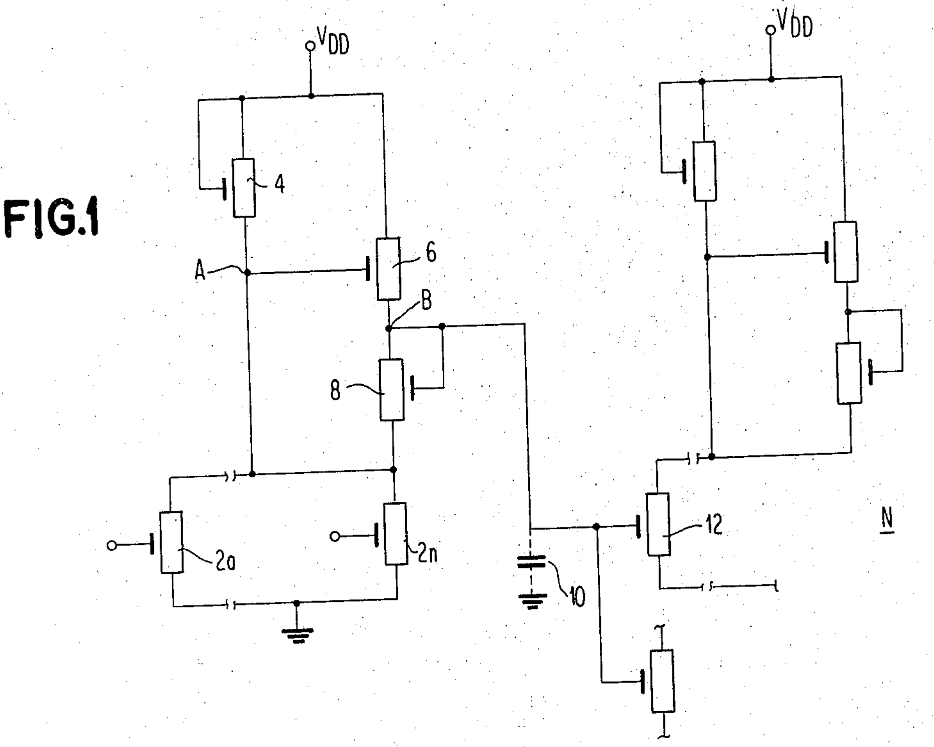
FIG. 1 is a circuit diagram of the preferred embodiment of the present invention.

FIG. 1 illustrates a NOR circuit incorporating the present invention. The inputs to the NOR circuit are applied to the gates of FETs **2*a* through 2*n*. When logic 0's are applied to all of the gates of 2*a* through 2*n*, that is, none of the gates are above their threshold voltage, then FETs 4 and 6 are ON and a voltage at node A, $V_A = V_{DD} - V_4$ where $V_4$ is the gate-to-source voltage across FET 4. FET diode 8 is OFF and capacitor 10 which represents the interconnection capacitance, of the interconnection of the output of logic stage 1 to logic stage N, is charged from $V_{DD}$ through FET 6. When capacitance 10 is fully charged, the voltage across it is greater than the threshold voltage of FET 12, which is the input FET of logic stage N, thus turning ON FET 12. Logic stage N is a NOR circuit similar to stage 1**.

Capacitor 10 is charged to a voltage $V_C$ which is equal to $V_{DD} - V_4 - V_6$ where $V_6$ is the gate to source voltage of FET 6. This voltage is sufficient to turn ON the input FETs of all of the succeeding logic stages. The threshold voltage of FET 4 and FET 6 is less than the threshold voltage of FET 2; therefore, the gate-to-source voltage drops across FET 4 and FET 6 is less than it would be if they had the same threshold as devices FET 2, as would be necessary in a single threshold technology. Since the output of the logic NOR circuit is at the source of FET 6, it can be seen for a given $V_{DD}$ the voltage level of logic 1 is higher for multiple thresholds than if all FETs had the same threshold voltages.

The gate of FET 6 has a large width/length ratio, so that the output voltage on the source of FET 6 follows the rising waveshape of the voltage on its gate. In this manner, the rising output waveform is independent of the fan out and loading represented by the interconnection capacitance 10.

When one of the input FETs 2a through 2n is turned ON by applying a gate voltage greater than its threshold voltage, the voltage $V_A$ at node A immediately decreases turning OFF FET 6. Furthermore, a discharge path for the charge stored on the capacitance 10 is created through diode 8 and the one of input FETs 2a through 2n which is turned ON. The discharge of capacitance 10 lowers the voltage on the gate of FET 12 and thereby turns it OFF.

The ratio of the conductance of FETs 2a through 2n to FET 4 is chosen so that $V_A < V_{T12} - V_{TD}$, where $V_{T12}$ is the threshold voltage of FET 12 and $V_{TD}$ is the threshold voltage of diode 8. This is only possible if $V_{T12} > V_{TD}$. This is achieved if the chip is designed with FETs having different threshold voltages.

The conductance of diode 8 is made arbitrarily large so that the discharge of capacitance 10 is controlled by the conductance of FETs 2a through 2n which are turned ON by input signals applied to their gates. Increasing the conductance of FETs 2a through 2n also increases the interelectrode capacitances of the FETs. However, since the interelectrode capacitance does not affect the preceding stage as is described above because the preceding stage is the same as the stage just described, the FETs 2a through 2n can be designed for optimizing the fall time by giving them large conductances with the resulting large interelectrode capacitances but not the normal disadvantages associated therewith.

The only power dissipated in the quiescent ON state due to the current flow is in FET 4, which is designed to have a low conductance. The FETs having a large conductance, i.e., FETs 2a -2n and FET 8, are only in the circuit during the discharge of capacitance 10.

Furthermore, the circuit operation remains essentially unchanged if the FETs 2a through 2n are placed with a network of series and/or parallel transistors to form NAND, OAI (OR-AND inverter) or AOI (AND-OR inverter) logic functions.

Figure 2:
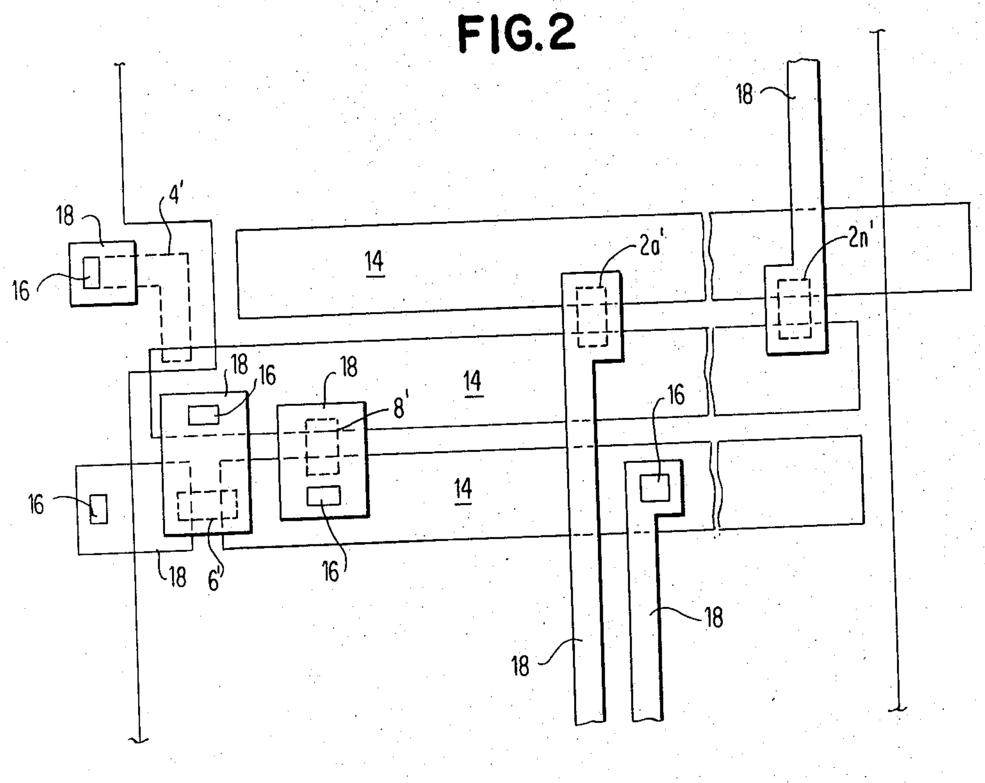
FIG. 2 illustrates the layout of an integrated circuit incorporating the present invention.

FIG. 2 illustrates a layout of an integrated circuit incorporating the present invention. The layout is consistent with the Weinberger algorithm disclosed in U.S. Pat. No. 3,475,621. Although this layout uses somewhat more area than a standard NOR circuit, the circuit may be used as an off chip driver since it can drive large off chip capacitances without being affected thereby.

Areas 14 represent the diffused regions forming the sources and drains of the FETs shown in FIG. 1. Connections are made to the sources and drains by contacts 16 while 18 is the metallization for providing the interconnections within the circuit. The dotted areas represent the gate electrodes of the various FETs and are numbered corresponding to their respective FET, using a prime.

While the invention has been particularly shown and described with reference to the preferred embodiment thereof, it will be understood by those skilled in the art that various changes in form and details may be made therein without departing from the spirit and scope of the invention.

1. In an integrated logic circuit comprising a plurality of FETs on a single chip wherein at least two of said plurality of FETs have their gates connected to a common node, the improvement:

a. wherein the first of said at least two of said plurality of FETs has a first threshold voltage, said first of said plurality of FETs having its gate and drain electrodes connected in common; and b. wherein the second of said at least two of said plurality of FETs has a second threshold voltage having the same polarity of said first threshold voltage, said second threshold voltage being greater in absolute magnitude than said first threshold voltage such that when the source of said first of said plurality of FETs is grounded the potential developed at the gate of said first of said plurality of FETs is equal to the threshold of said first of said plurality of FETs and below the threshold of said second of said plurality of FETs to cause said second of said plurality of FETs to cease conduction.

2. An integrated logic circuit comprising:

a. a first FET having its gate connected to a first voltage source, its drain connected to a second voltage source, and its source connected to a first node;

b. a second FET having its drain connected to said second voltage source, its gate connected to said first node and its source connected to a second node;

c. a third FET having its gate and drain connected to said second node and its source connected to said first node;

d. a plurality of input means connected to said first node; and e. a plurality of output means each including an input FET having its gate connected to said second node;

and wherein the gate regions of said third FET and said input FETs are formed such that the threshold voltage of said third FET is the same polarity but less in absolute magnitude than the threshold voltage of said input FETs.

3. The integrated logic circuit as set forth in claim 2 wherein the gate voltage of said input FETs is the voltage on the interconnection capacitance between said second node and said input FET, whereby said interconnection capacitance is charged through said second FET when said second FET is ON, thereby turning ON said input FETs and said interconnection capacitance is discharged through said third FET and one of said input means when said one of said input means is turned ON thereby turning OFF said input FETs.

4. The integrated logic circuit as set forth in claim 3 wherein when said one of said input means turns ON, said second FET turns OFF and said third FET turns ON.

5. The integrated logic circuit as set forth in claim 4 wherein the ratio of conductance of the first FET to the input means is such that the voltage at said first node is less than the threshold voltage of said input FET minus the gate to source voltage of said third FET.

6. The integrated logic circuit as set forth in claim 5 wherein the width to length ratio of the gate of said second FET is relatively large whereby the voltage on the source of said second FET follows the rising voltage on said first node.

7. The integrated circuit as set forth in claim 3 wherein the conductance of said third FET is high such that the discharge time of said interconnection capacitance is a function of a conductance of said input means.

8. The integrated circuit as set forth in claim 2 wherein said input means comprises a plurality of FETs each having its drain connected to said first node wherein an input signal may be applied to the gates of any of said plurality of FETs.

9. The integrated circuit as set forth in claim 2 wherein the the threshold voltage of said first and second FETs is different from the threshold voltage of said input means whereby the logic 1 level at said second node is increased.

10. The integrated circuit as set forth in claim 2 wherein the conductance of said first FET is low and wherein quiescent power is dissipated in said first FET.

11. The integrated circuit as set forth in claim 2 wherein said input means is a parallel FET network means.

12. The integrated circuit as set forth in claim 2 wherein said first and second voltage sources are the same voltage source.

* * * * *